United States Patent
Tang et al.

(10) Patent No.: US 8,159,025 B2
(45) Date of Patent: Apr. 17, 2012

(54) GATE ELECTRODE IN A TRENCH FOR POWER MOS TRANSISTORS

(75) Inventors: Ming Tang, Hsinchu (TW); Shih-Ping Chiao, Hsinchu (TW)

(73) Assignee: PTEK Technology Co., Ltd., Hsinchu (TW)

( * ) Notice: Subject to any disclaimer, the term of this patent is extended or adjusted under 35 U.S.C. 154(b) by 255 days.

(21) Appl. No.: 12/683,014

(22) Filed: Jan. 6, 2010

(65) Prior Publication Data

US 2011/0163374 A1 Jul. 7, 2011

(51) Int. Cl.
*H01L 29/66* (2006.01)
*H01L 21/336* (2006.01)

(52) U.S. Cl. .......... 257/330; 257/520; 257/E29.26; 438/259; 438/270

(58) Field of Classification Search .......... None
See application file for complete search history.

(56) References Cited

U.S. PATENT DOCUMENTS

| 6,433,385 B1 * | 8/2002 | Kocon et al. | 257/328 |
| 6,858,500 B2 * | 2/2005 | Sugi et al. | 438/270 |
| 7,033,891 B2 * | 4/2006 | Wilson et al. | 438/270 |
| 7,352,036 B2 * | 4/2008 | Grebs et al. | 257/401 |
| 7,732,876 B2 * | 6/2010 | Grebs et al. | 257/401 |
| 7,781,832 B2 * | 8/2010 | Tang et al. | 257/334 |
| 2001/0023961 A1 * | 9/2001 | Hshieh et al. | 257/330 |
| 2008/0116510 A1 * | 5/2008 | Kocon et al. | 257/328 |

* cited by examiner

*Primary Examiner* — Alonzo Chambliss
(74) *Attorney, Agent, or Firm* — WPAT, P.C.; Anthony King

(57) ABSTRACT

A trench-typed power MOS transistor comprises a trench-typed gate area, which includes a gate conductor and an isolation layer. A thin sidewall region of the isolation layer is formed between the gate conductor and a well region. A thick sidewall region of the isolation layer is formed between the gate conductor and a double diffusion region. A thick bottom region of the isolation layer is formed between the gate conductor and a deep well region.

10 Claims, 30 Drawing Sheets

GATE ELECTRODE IN A TRENCH FOR POWER MOS TRANSISTORS

BACKGROUND OF THE INVENTION

1. Field of the Invention

The present invention relates to MOS transistors and manufacturing process thereof, and more particularly, to trench-typed power MOS transistors and manufacturing process thereof.

2. Description of the Related Art

Power MOS transistors are a specific type of MOS transistor used for providing and switching power in an integrated circuit. Accordingly, power MOS transistors must be able to work normally under high voltage. Therefore, it is typical for a power MOS transistor cell manufactured by CMOS process to be of a large size in order to be capable of operation under high voltage. On the other hand, it is also a requirement that power MOS transistors be able to output large current. Therefore, it is also typical to combine a large number of power MOS transistor cells into a single power MOS transistor, wherein each power MOS transistor cell outputs a relatively small amount of current. However, such a power MOS transistor must be very large, which may be unacceptable in view of manufacturing requirements nowadays.

To reduce the size of power MOS transistors, a vertical diffused MOS (VDMOS) transistor is introduced. FIG. 1 shows a schematic view of a VDMOS transistor. Unlike traditional planar CMOS transistors, the current flows vertically in a VDMOS transistor. As shown in FIG. 1, the source region is on the top of the VDMOS transistor 100, and the drain region is on the bottom of the VDMOS transistor 100. Such structure enables the VDMOS transistor 100 both a high breakdown voltage and a high current output.

FIG. 2 shows a schematic view of another type of trench typed MOS transistor, i.e. a UMOS transistor. The name "UMOS" derives from the U-shaped gate oxide of the UMOS transistor 200. As shown in FIG. 2, the UMOS transistor 200 has a trench-shaped gate extending into the silicon, and the current also flows vertically in a UMOS transistor. Similar to VDMOS transistors, the source region is on the top of the UMOS transistor 200, and the drain region is on the bottom of the UMOS transistor 200.

However, since VDMOS and UMOS transistors both adopt a vertical structure, they cannot be manufactured or integrated with other logic circuits on a CMOS-processed chip. As a result, the manufacturing of an integrate circuit utilizes either VDMOS transistors or UMOS transistors as power MOS transistors is both complicated and expensive. Accordingly, there is a need to design a power MOS transistor that not only can maintain a high breakdown voltage, high output current, high operation speed, but also adopts a horizontal structure such that it can be integrated with other logic circuits on a CMOS-processed chip.

SUMMARY OF THE INVENTION

The trench-typed power MOS transistor according to one embodiment of the present invention comprises a drain region, a double diffusion doping region, a trench-typed gate region, a source region, a well region, a deep well region and a substrate region. The drain region has a first conductivity type property and is connected to a drain electrode. The double diffusion doping region has the first conductivity type property and is disposed under the drain region. The trench-typed gate region has a gate conductor and an insulating layer, wherein the insulating layer extends into the double diffusion doping region to insulate the gate conductor. The source region has a first conductivity type property and is connected to a source electrode. The well region has a second conductivity type property and is disposed under the source region. The deep well region has a first conductivity type property and is disposed under the double diffusion doping region and the well region. The substrate region is disposed under the deep well region. The insulating layer forms a thin sidewall region between the gate conductor and the well region, a thick sidewall region between the gate conductor and the double diffusion doping region, and a thick bottom region between the gate conductor and the deep well region. The drain electrode and the source electrode are disposed on the top surface of the trench-typed power MOS transistor.

The manufacture method for trench-typed power MOS transistor according to one embodiment of the present invention comprises the steps of: forming a deep well region having a first conductivity type property above a substrate region; forming a double diffusion doping region having a first conductivity type property above the deep well region; etching sidewall of the double diffusion doping region to form a trench region; filling insulating material into the trench region; etching the sidewall of the insulating material opposing the double diffusion doping region to form a gate region such that the trench region comprises a thick sidewall region filled with the insulating material between the gate region and the double diffusion doping region and a thick bottom region filled with the insulating material between the gate region and the deep well region; filling gate conductor into the gate region; forming a well region having a second conductivity type property beside the gate region and above the deep well region; forming a drain region having a first conductivity type property above the double diffusion doping region; and forming a source region having a first conductivity type property above the well region.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
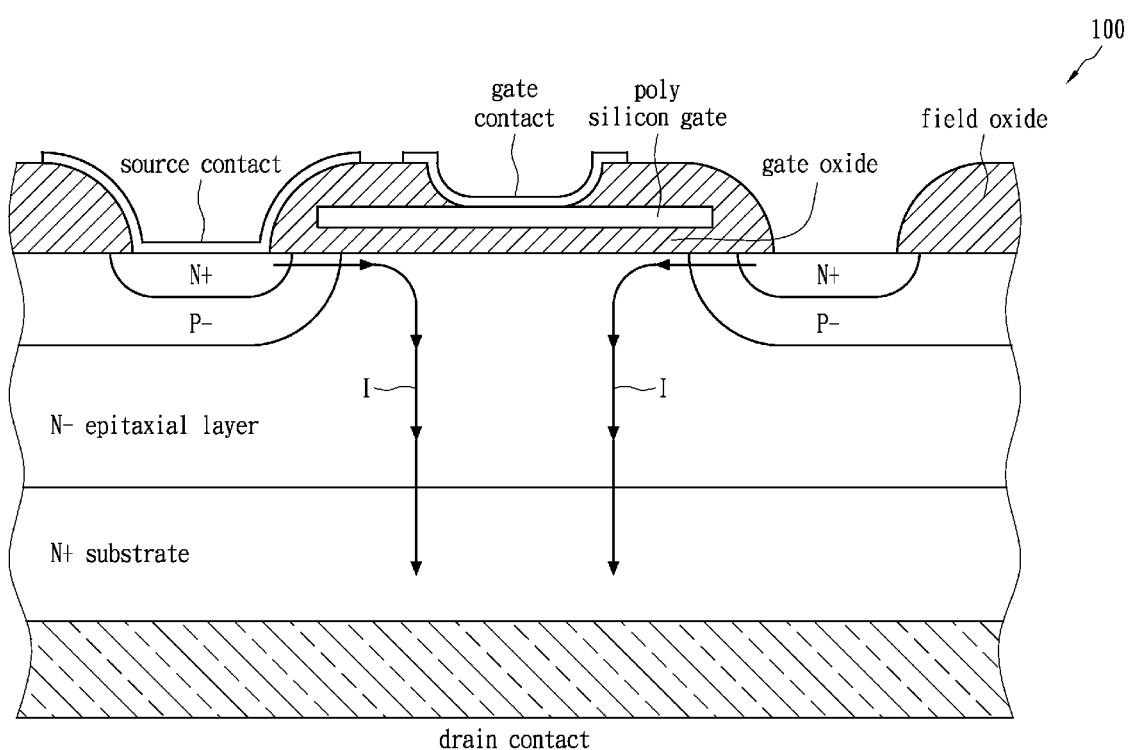
FIG. 1 shows a schematic view of a VDMOS transistor.
Figure 2:
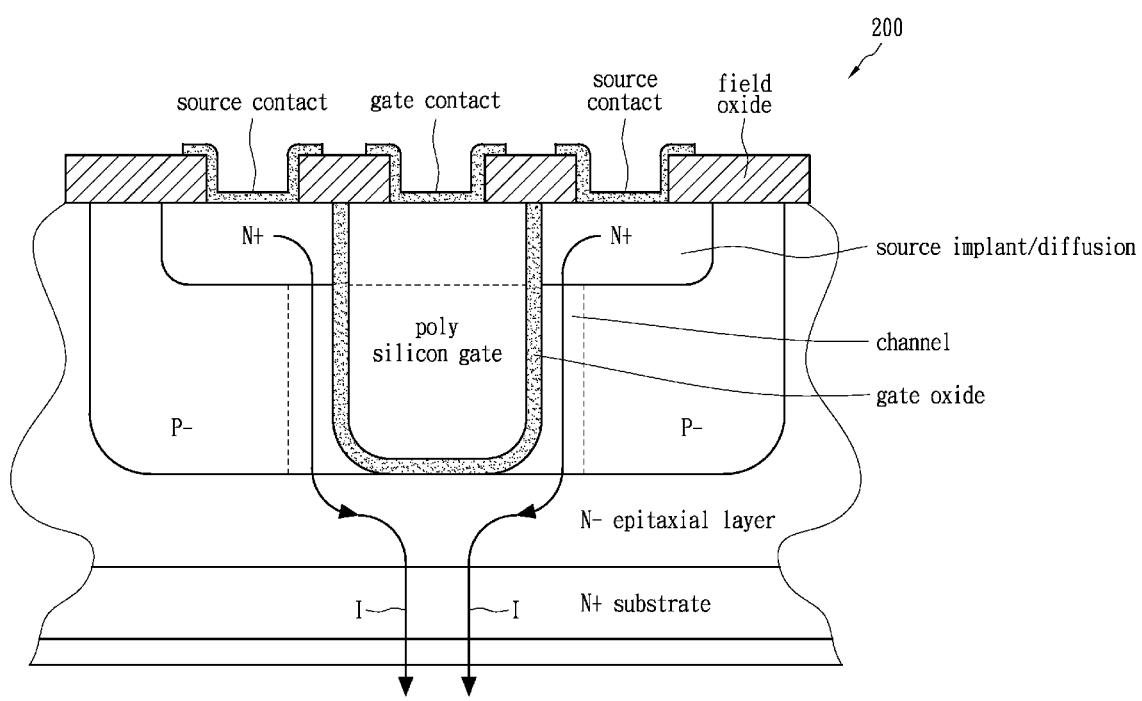
FIG. 2 shows a schematic view of a UMOS transistor.
Figure 3:
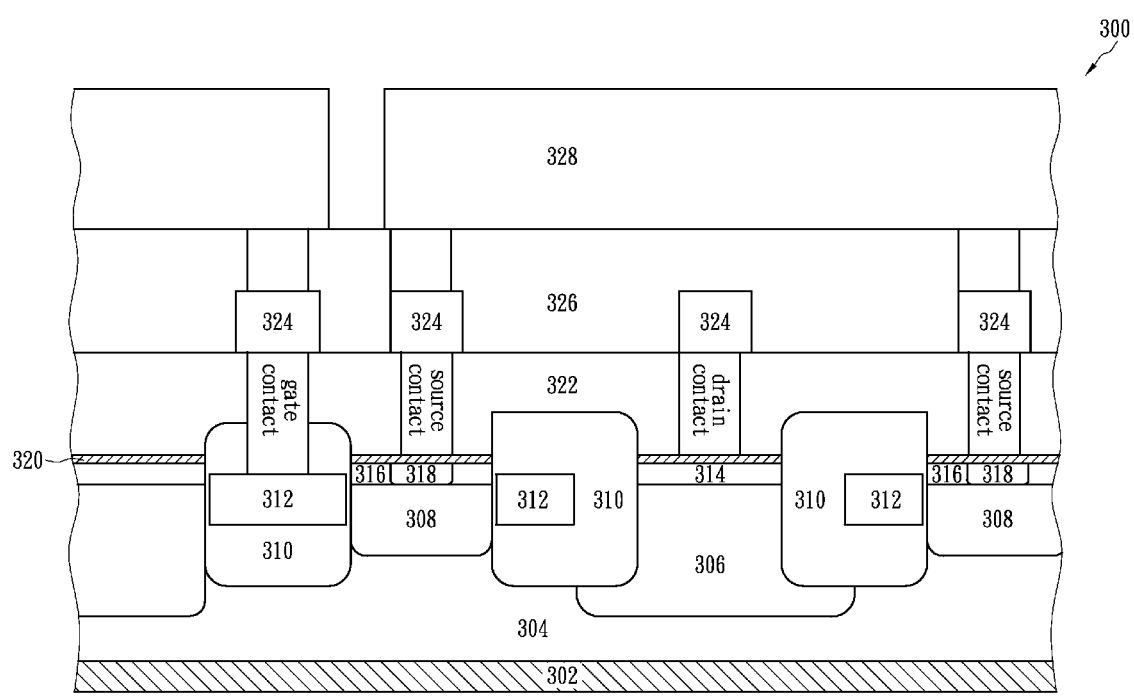
FIG. 3 shows a schematic view of a trench-typed power MOS transistor according to one embodiment of the present invention.

FIG. 3 shows a schematic view of a trench-typed power MOS transistor according to one embodiment of the present invention. As shown in FIG. 3, the trench-typed power MOS transistor 300 comprises a substrate region 302, a deep well region 304, a double diffusion doping region 306, a well region 308, an insulating layer 310, a gate conductor 312, a drain region 314, a source region 316, a body region 318, a metal silicide layer 320, an inter layer dielectric layer 322, a first metal layer 324, an inter metal dielectric layer 326 and a top metal layer 328.

The trench-typed power MOS transistor 300 shown in FIG. 3 is an N-type MOS transistor. However, persons skilled in the art can easily adapt to a P-type MOS transistor without departing from the scope of the claimed invention. As shown in FIG. 3, the drain region 314 has N type conductivity property and is connected to a drain electrode. The double diffusion doping region 306 has N type conductivity property and is disposed under the drain region 314. Preferably, the doping concentration of the double diffusion doping region 306 closer to the drain region 314 is higher than the doping concentration of the double diffusion doping region 306 farther from the drain region 314. The insulating layer 310 extends into the double diffusion doping region 306 to insulate the gate conductor 312. The insulating layer 310 and the gate conductor 312 forms a trench-typed gate region, which horizontally surrounds the well region 308. A gate electrode is connected the gate conductor 312 at the end opposing the drain region 314. The source region 316 has P type conductivity property, surrounds the body region 318, and is connected to a source electrode. The well region 308 has P type conductivity property and is disposed under the source region 316. The deep well region has a P type conductivity property and is disposed under the double diffusion doping region 306 and the well region 308. The substrate region 302 has P type conductivity property and is disposed under the deep well region 304. The metal silicide layer 320 is between the source region 314 and the source electrode and between the drain region 316 and the body region 318 and the drain electrode. The inter layer dielectric layer 322 is disposed above the metal silicide layer 320. The first metal layer 324 connects the source electrode, the drain electrode and the gate electrode to the top metal layer 328. The inter metal dielectric layer 326 is disposed between the first metal layer 324 and the top metal layer 328.

As shown in FIG. 3, the insulating layer 310 forms a thin sidewall region between the gate conductor 312 and the well region 308, a thick sidewall region between the gate conductor 312 and the double diffusion doping region 306, and a thick bottom region between the gate conductor 312 and the deep well region 304. The drain electrode, the source electrode and the gate electrode are disposed on the top surface of the trench-typed power MOS transistor 300.

Figure 4:
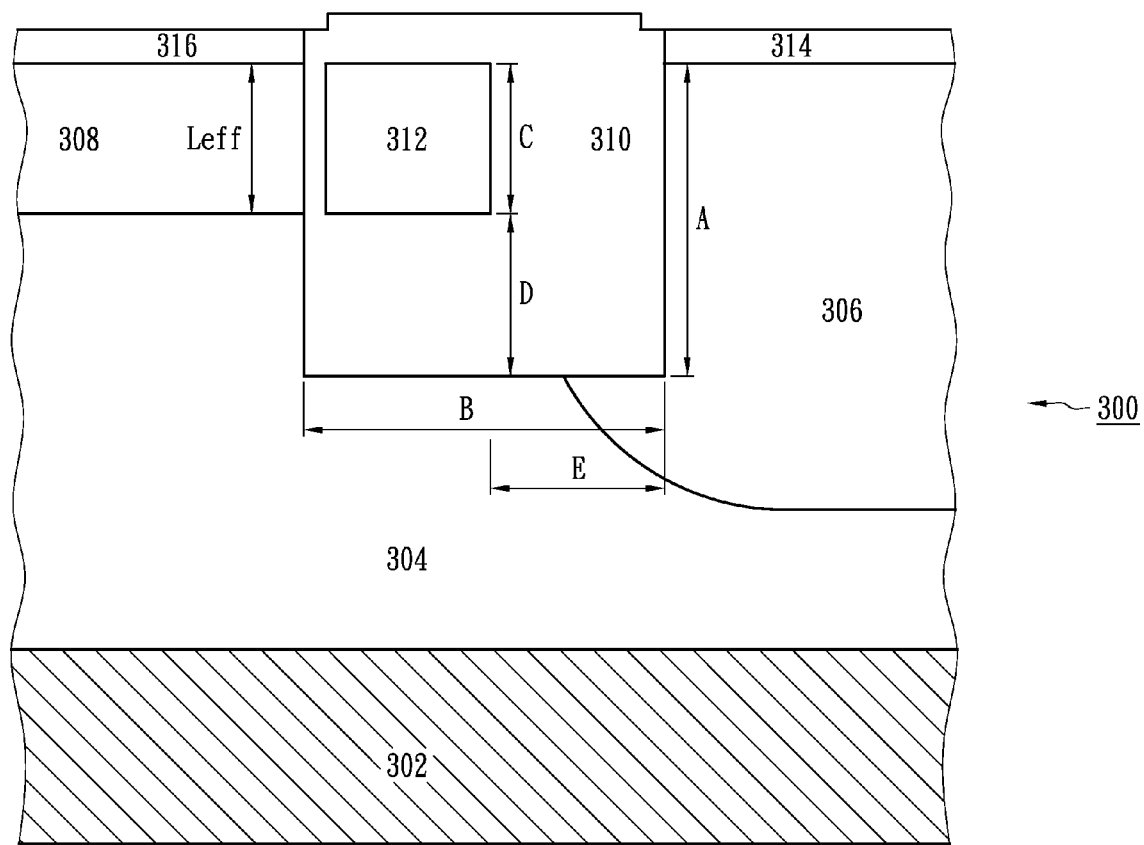
FIG. 4 shows a partially enlarged view of a trench-typed power MOS transistor according to one embodiment of the present invention.

FIG. 4 shows a partially enlarged view of the trench-typed power MOS transistor 300. As shown in FIG. 4, when the trench-typed power MOS transistor 300 is turned on, a channel is form from the source region 314 alongside the sidewall of the insulating layer 310 to the drain region 316. As shown in FIG. 4, the effective channel length $L_{eff}$, approximately the depth of the well region 308, is very short. As a result, the resistance of the channel is reduced. In addition, since the double diffusion doping region 306 where the channel is formed contains a high doping concentration, the resistance of the channel is further reduced. Therefore, the trench-typed power MOS transistor 300 has a low on-resistance and can provide a high output current accordingly.

On the other hand, the thickness of the thick sidewall region of the insulating layer 310 between the gate conductor 312 and the double diffusion doping region 306 enhances the breakdown voltage of the trench-typed power MOS transistor 300. The thickness of the thick bottom region of the insulating layer 310 between the gate conductor 312 and the deep well region 304 also enhances the breakdown voltage of the trench-typed power MOS transistor 300. Therefore, the trench-typed power MOS transistor 300 exhibits a high breakdown voltage. In practice, the breakdown voltage of the trench-typed power MOS transistor 300 can be adjusted by modifying the thicknesses of the thick sidewall region and the thick bottom region.

Preferably, to obtain a breakdown voltage lower than 100 volts, the depth A of the insulating layer 310 can be designed to be less than 2 micrometers, the width B of the insulating layer 310 can be designed to be less than 2 micrometers, the depth C of the gate conductor 312 can be designed to range from 1 to 2 micrometers, the thickness D of the thick bottom region can be designed to range from 0.02 to 1 micrometer, and the thickness E of the thick sidewall region can be designed to range from 0.2 to 1 micrometer. Preferably, to obtain a breakdown voltage higher than 100 volts, the depth A of the insulating layer 310 can be designed to be greater than 2 micrometers, the width B of the insulating layer 310 can be designed to be greater than 3 micrometers, the depth C of the gate conductor 312 can be designed to be greater than 1.6 micrometer, the thickness D of the thick bottom region can be designed to be greater than 0.6 micrometer, and the thickness E of the thick sidewall region can be designed to be greater than 1 micrometer.

Referring to FIG. 4, since the effective channel length $L_{eff}$ of the trench-typed power MOS transistor 300 is very short, the effective capacitance $C_{gb}$ from the body region 318 to the gate conductor 312 is very small. In addition, since the thickness of the thick sidewall region of the insulating layer 310 is relatively thick, the effective capacitance $C_{gd}$ from the source region 314 to the gate conductor 312 is also very small. Therefore, the trench-typed power MOS transistor 300 has a high operation speed.

Figure 5:
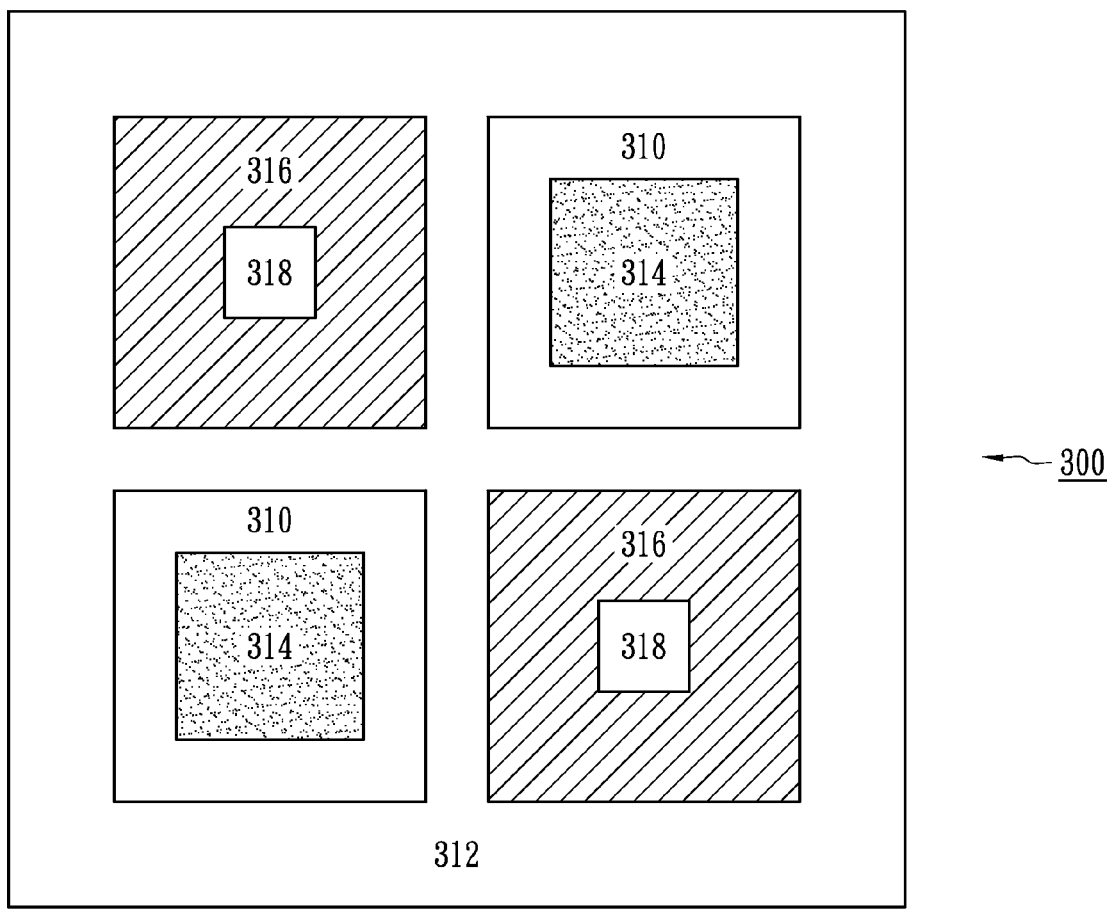
FIG. 5 shows a layout structure of a trench-typed power MOS transistor according to one embodiment of the present invention.

FIG. 5 shows the layout structure of the trench-typed power MOS transistor 300. As shown in FIG. 5, the insulating layer 310 surrounds the source region 314, the drain region 316 surrounds the body region 318, and the gate conductor 312 separates the source region 314 and the drain region 316.

FIGS. 6 to 30 show the manufacturing process of a trench-typed power MOS transistor according to one embodiment of the present invention. The manufacturing process shown from FIG. 6 to FIG. 30 is for an N-type MOS transistor. However, persons skilled in the art can easily adapt to a P-type MOS transistor without departing from the scope of the claimed invention.

Figure 6:
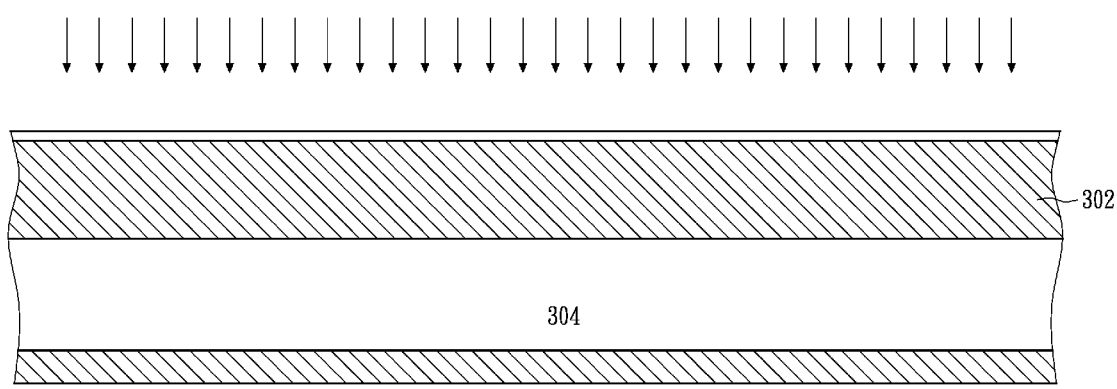
FIGS. 6 to 30 show the manufacturing process of a trench-typed power MOS transistor according to one embodiment of the present invention.
Figure 7:
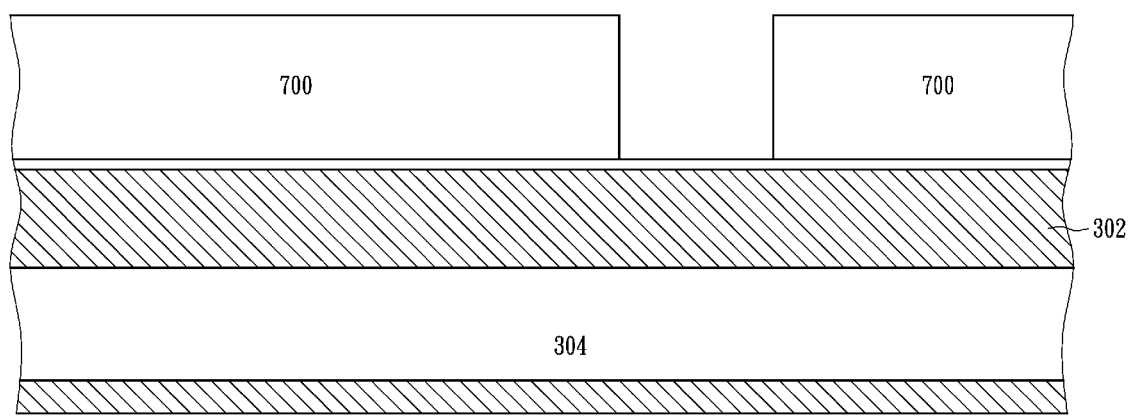
Figure 8:
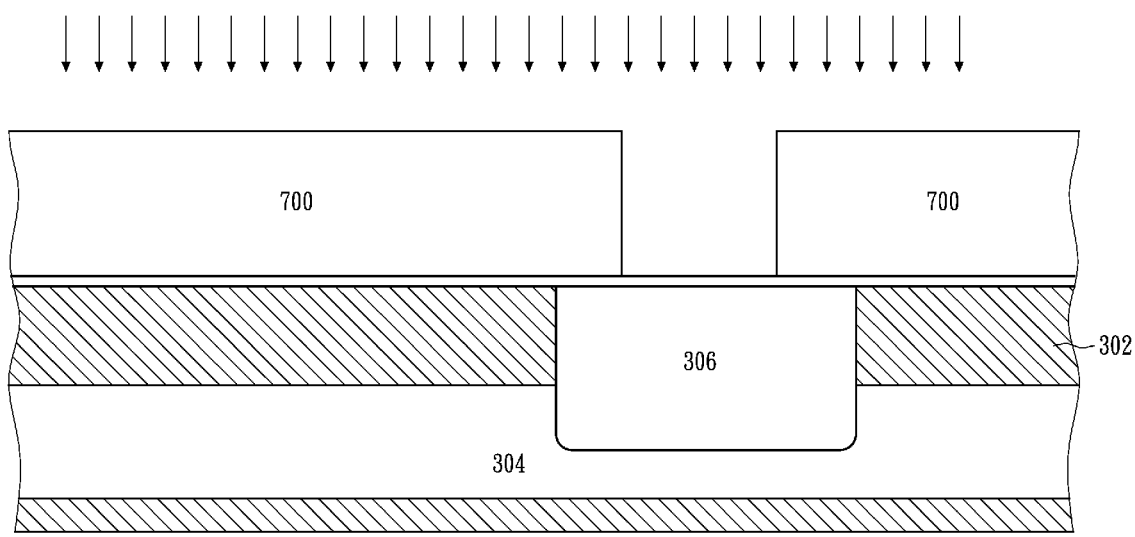
Figure 9:
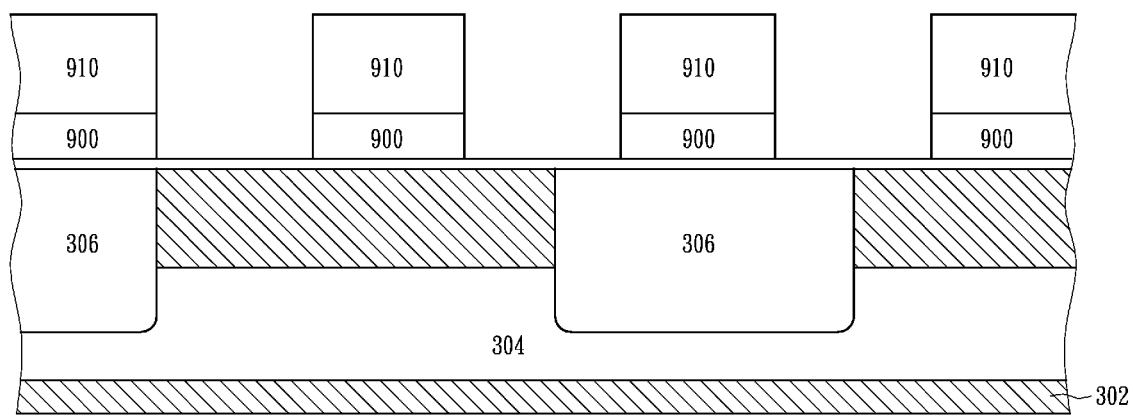
Figure 10:
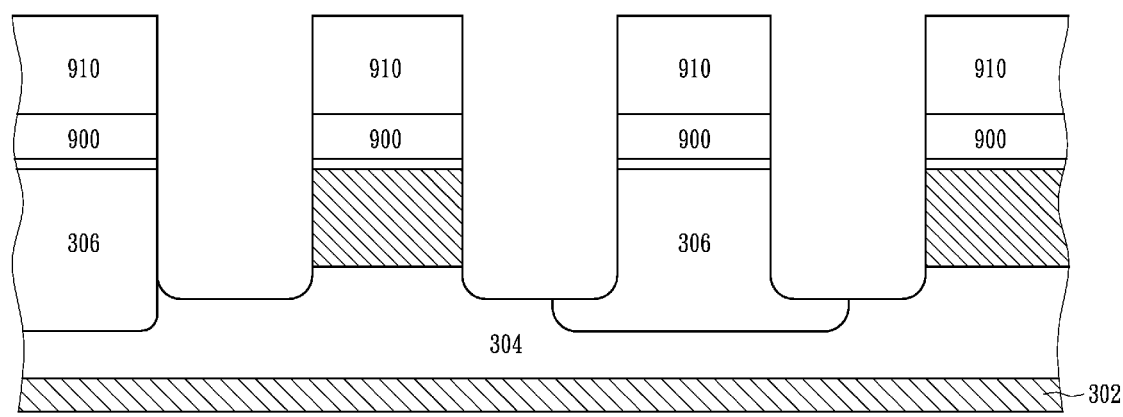
Figure 11:
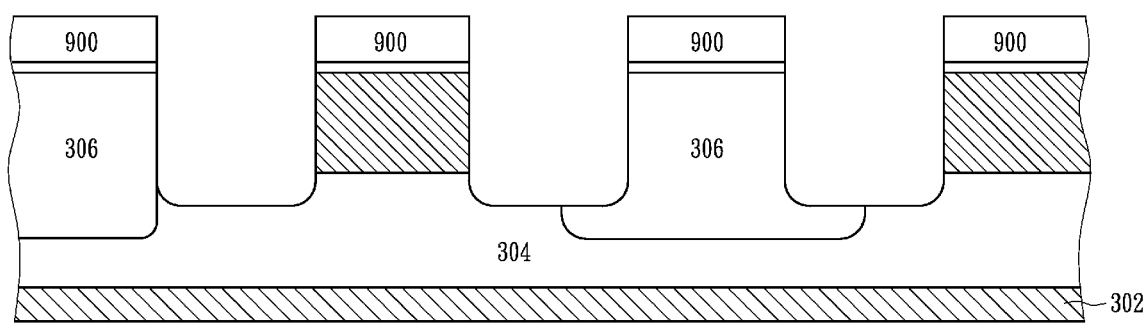
Figure 12:
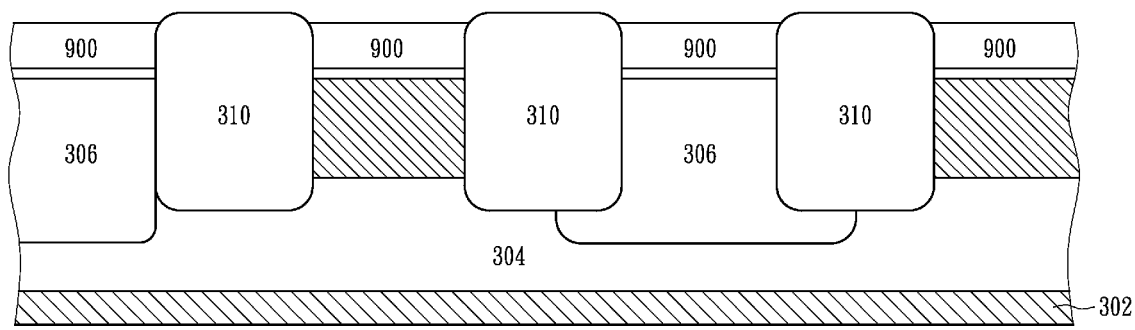
Figure 13:
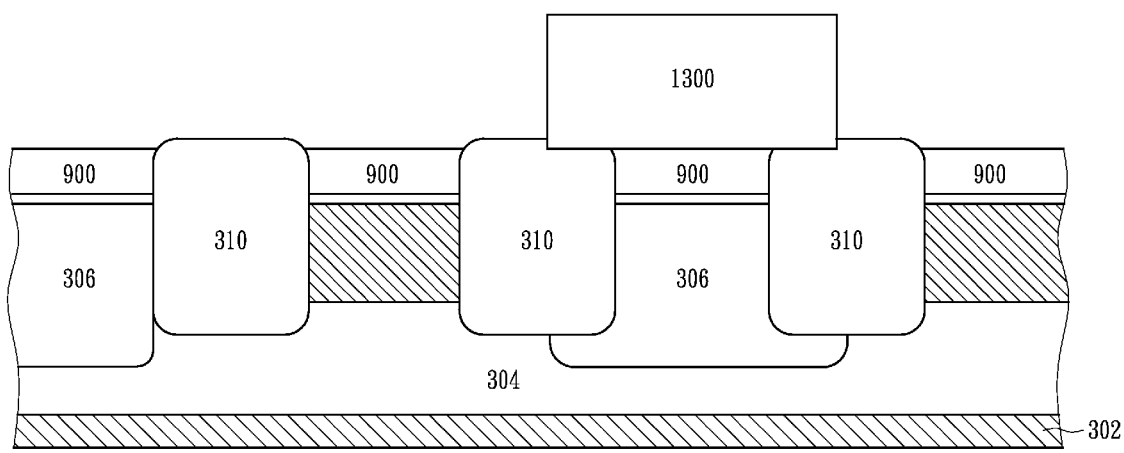
Figure 14:
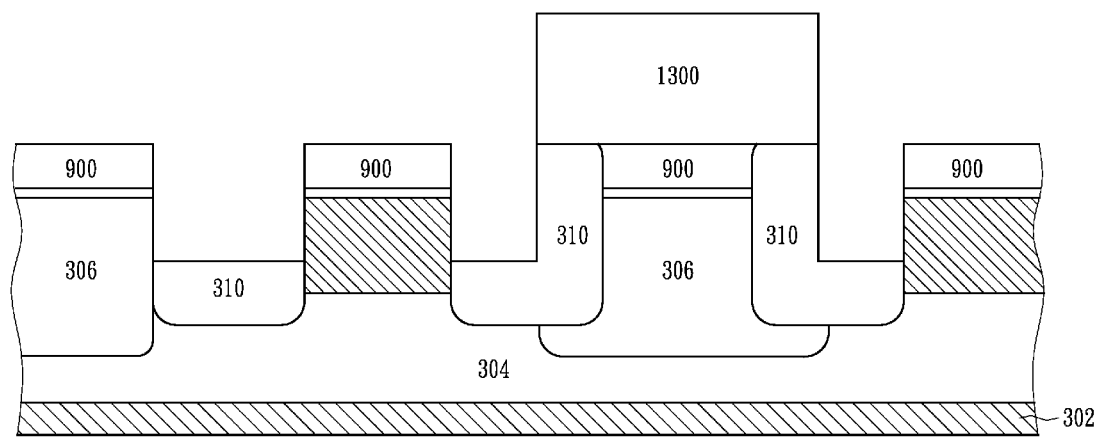

As shown in FIG. 6, the P type substrate region 302 is implanted with N-type dopant to form the deep well region 304. FIG. 7 shows that a double diffusion doping photo mask 700 is formed on the top of the substrate region 302. FIG. 8 shows that a double diffusion doping driving process is carried out at the unmasked region to form the double diffusion doping region 306, wherein the temperature of the double diffusion doping driving process is between 900 to 1000 Celsius degrees. FIG. 9 shows that the double diffusion doping photo mask 700 is removed, pad oxides/pad nitrides 900 are formed at the active area, and hard masks 910 are formed on the top of the pad oxides/pad nitrides 900, wherein the hard masks 910 are made of boron phosphate glass. FIG. 10 shows that the part of the double diffusion doping region 306 near the sidewall is etched away to form a trench region. As shown in FIG. 11, the hard masks 910 are then removed. FIG. 12 shows that the insulating layer 310 is disposed in the trench region, and the top surface of the insulating layer 310 is polished with the chemical mechanical polishing (CMP) technique, wherein the insulating layer 310 is made of oxide. FIG. 13 shows that a gate conductor photo mask 1300 is formed on the top of the double diffusion doping region 306. FIG. 14 shows that the unmasked part of the insulating layer 310 is etched away to form a gate region, wherein the result of the etching is that a thick sidewall region of the insulating layer 310 is formed between the gate region and the double diffusion doping region 306, and a thick bottom region of the insulating layer 310 is formed between the gate region and the deep well region 304. Preferably, the etching depth is between 1 and 2 micrometers.

Figure 15:
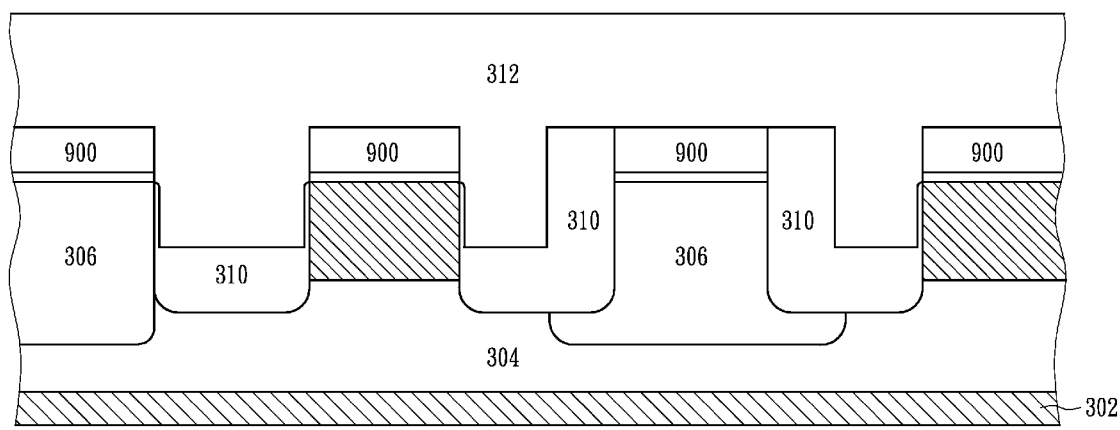
Figure 16:
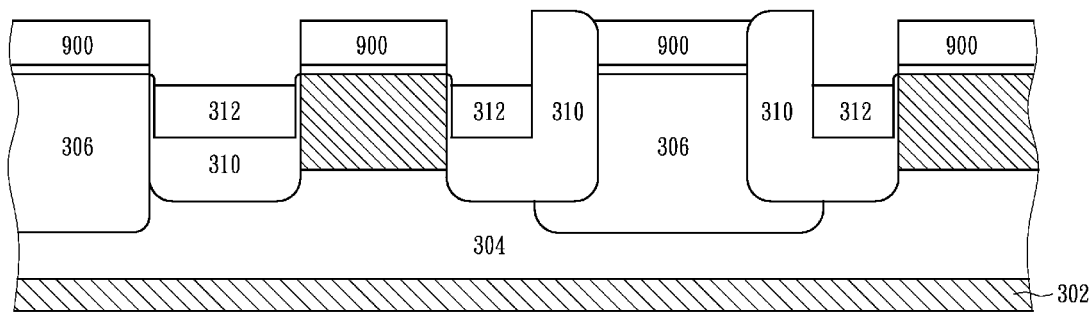
Figure 17:
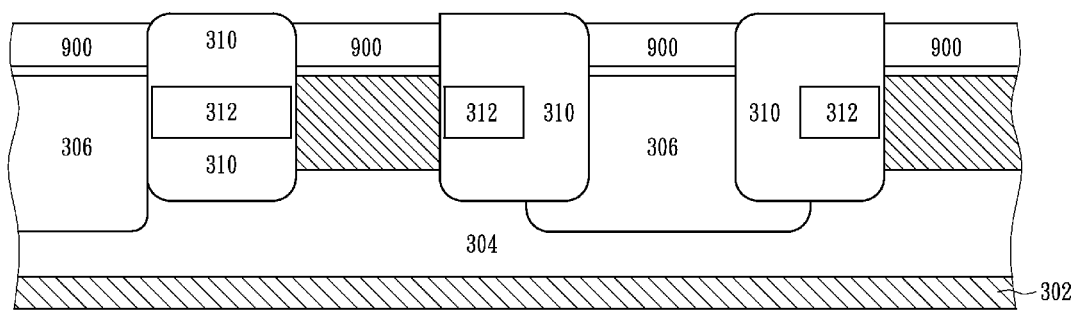
Figure 18:
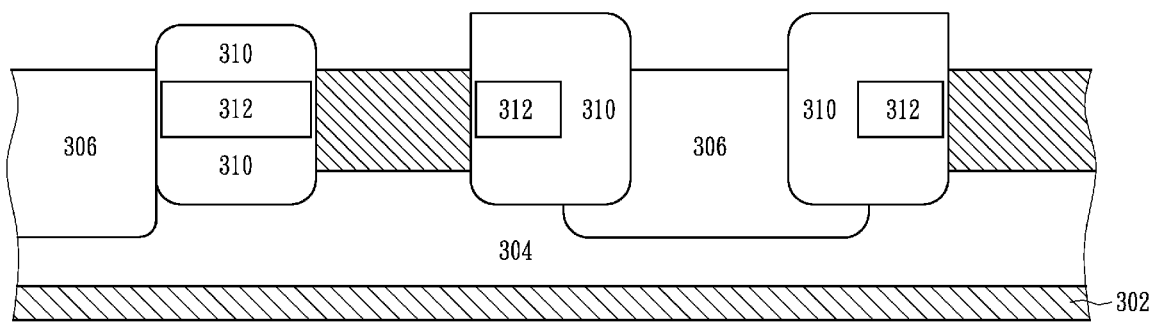
Figure 19:
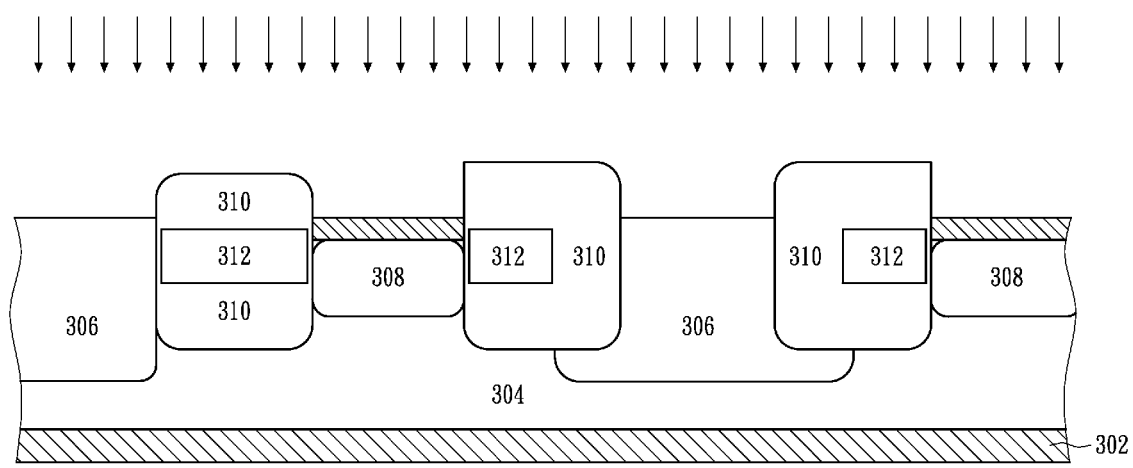
Figure 20:
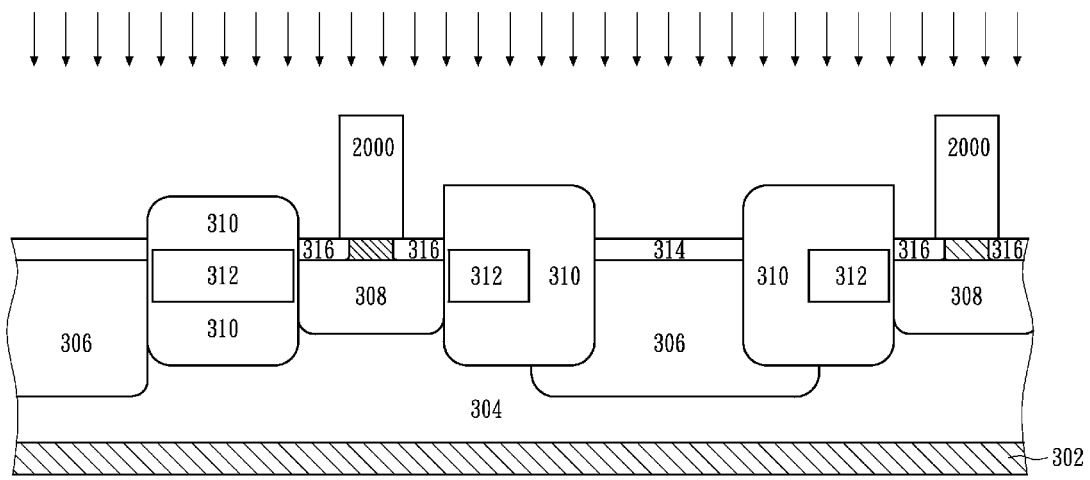
Figure 21:
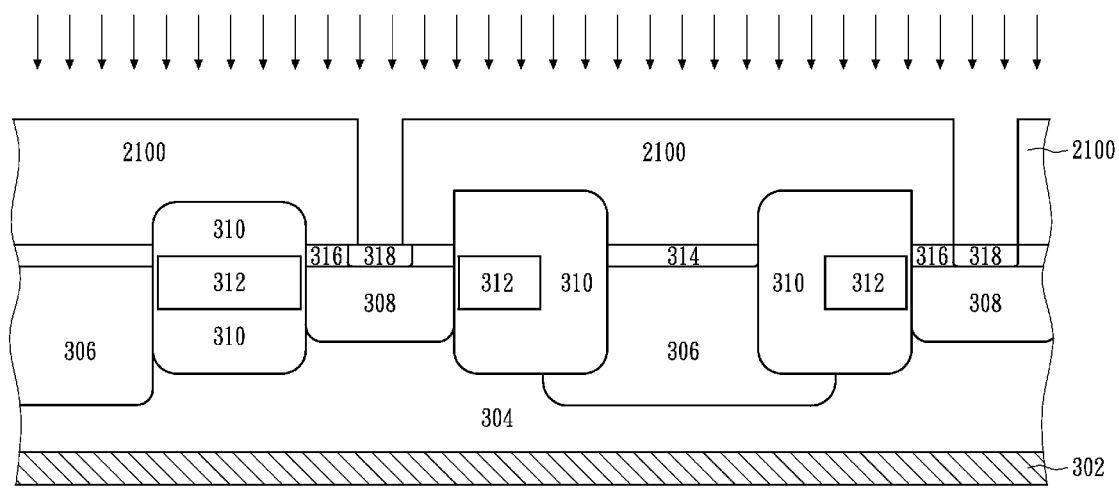
Figure 22:
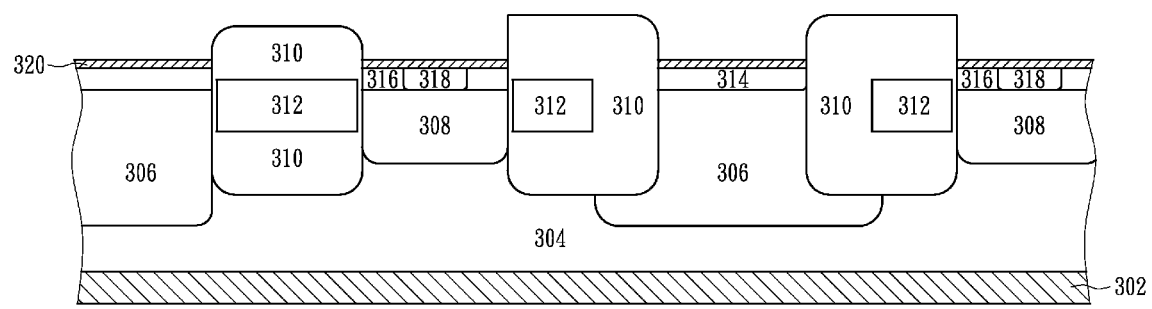
Figure 23:
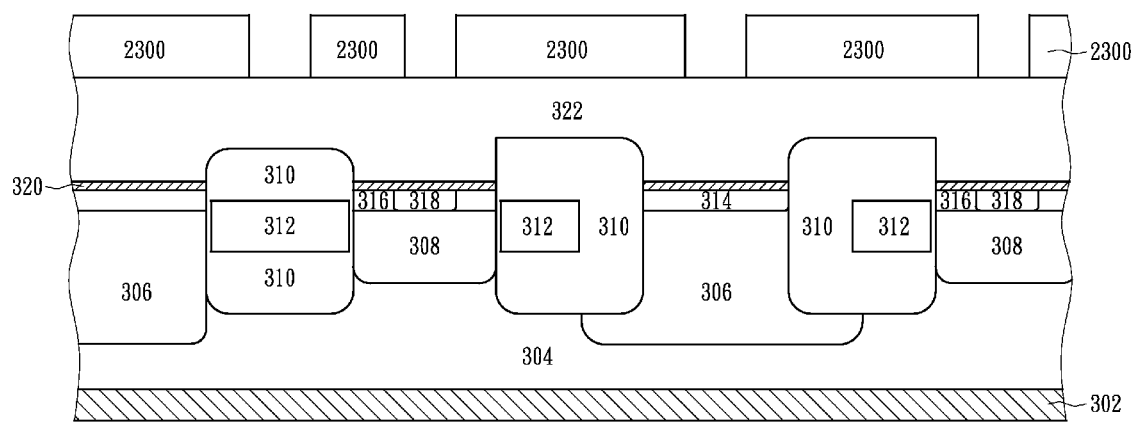

FIG. 15 shows that the gate conductor photo mask 1300 is removed, a gate oxide or insulating layer is grown or disposed along the sidewall of the trench region, and the gate conductor 312 is disposed in the trench region, wherein the gate conductor 312 is made of polysilicon or metal. FIG. 16 shows the etching of the gate conductor 312. FIG. 17 shows the deposition of the insulating layer 310 on the top of the gate conductor 312 and the polishing of the insulating layer 310 with the CMP technique, wherein the insulating layer 310 is made of oxide. FIG. 18 shows the removal of the pad oxides/pad nitrides 900. FIG. 19 shows that the P-type substrate region 302 is further implanted with P-type dopant to form the well region 308. FIG. 20 shows that source/drain photo masks 2000 are formed at the source/drain area, and the drain region 314 and the source region 316 are formed by N-type doping process. FIG. 21 shows that the source/drain photo masks 2000 are removed, body photo masks 2100 are formed, and the body region 318 is formed by a doping process. FIG. 22 shows that the body photo masks 2100 are removed, the metal silicide layer 320 is formed by junction annealing process, wherein the temperature of the junction annealing process is between 800 to 1000 Celsius degrees, and the metal of the metal silicide layer is titanium or cobalt. FIG. 23 shows that the inter layer dielectric layer 322 is formed on the top of the metal silicide layer 320, and contact photo masks 2300 are formed at the top of the inter layer dielectric layer 322, wherein the inter layer dielectric layer 322 is made of boron phosphate glass.

Figure 24:
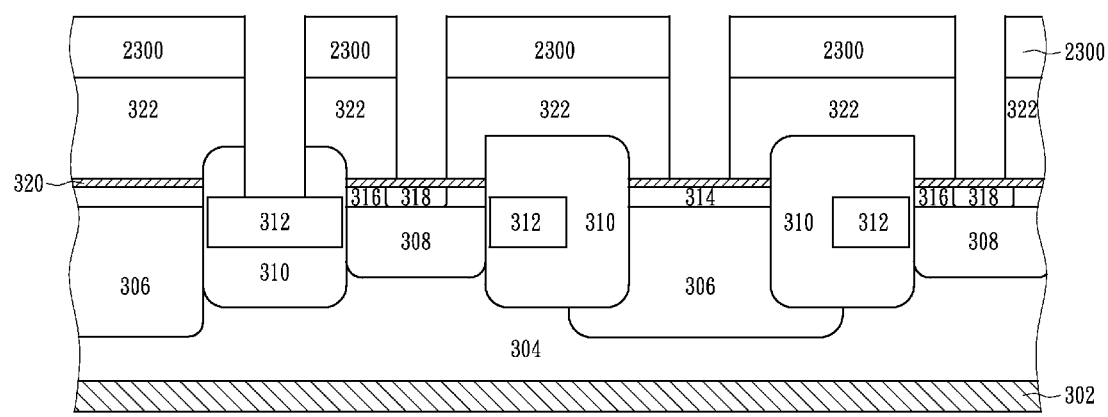
Figure 25:
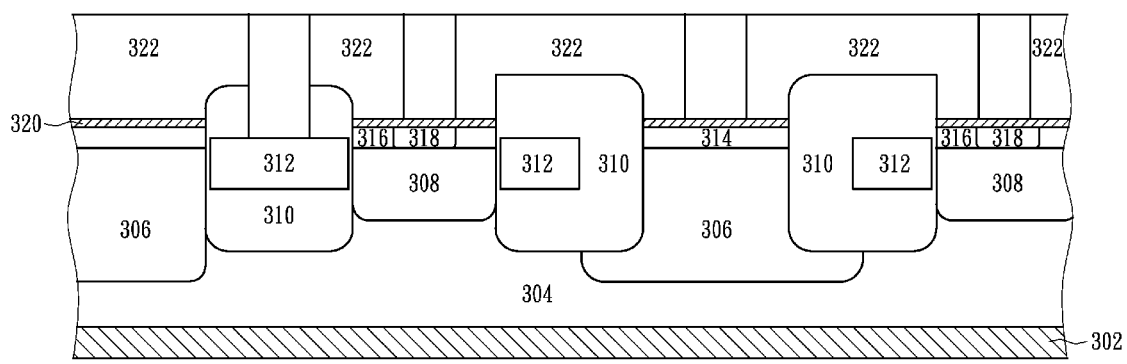
Figure 26:
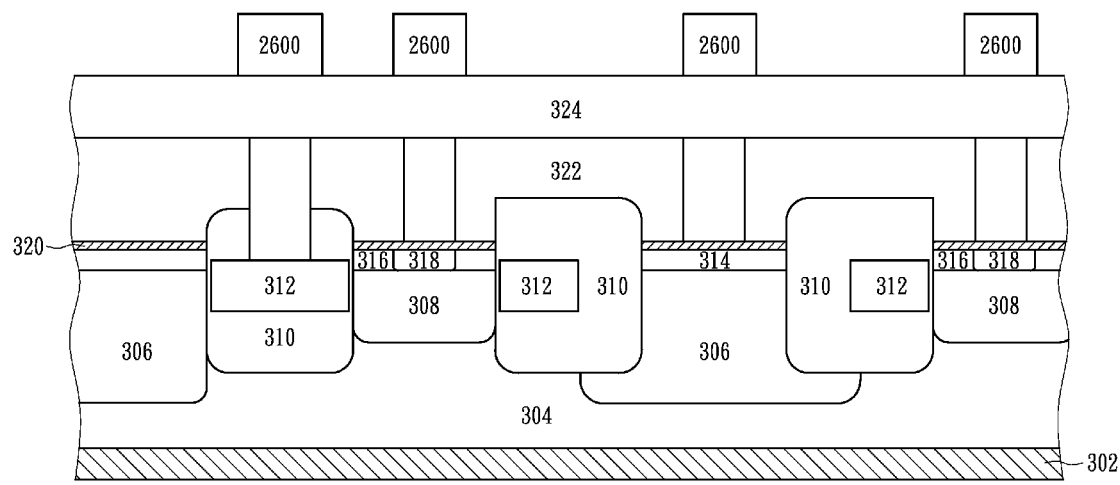
Figure 27:
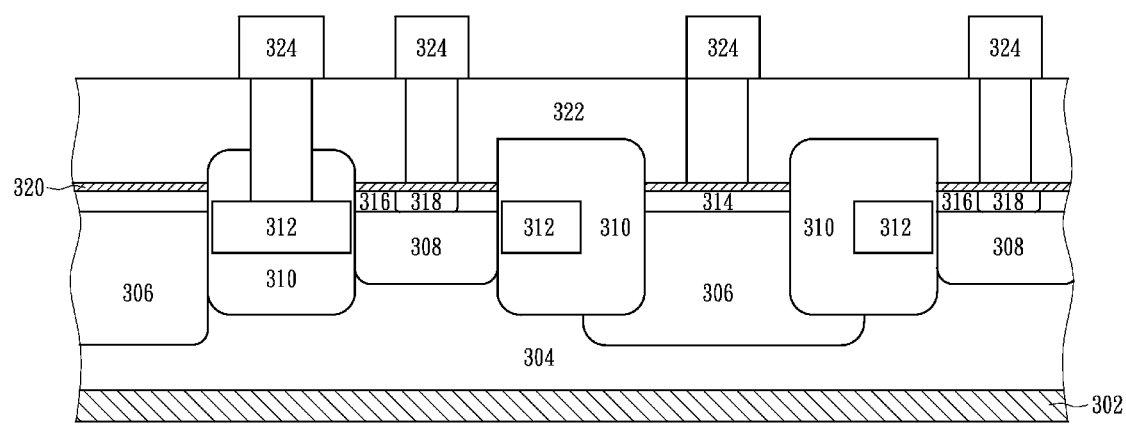
Figure 28:
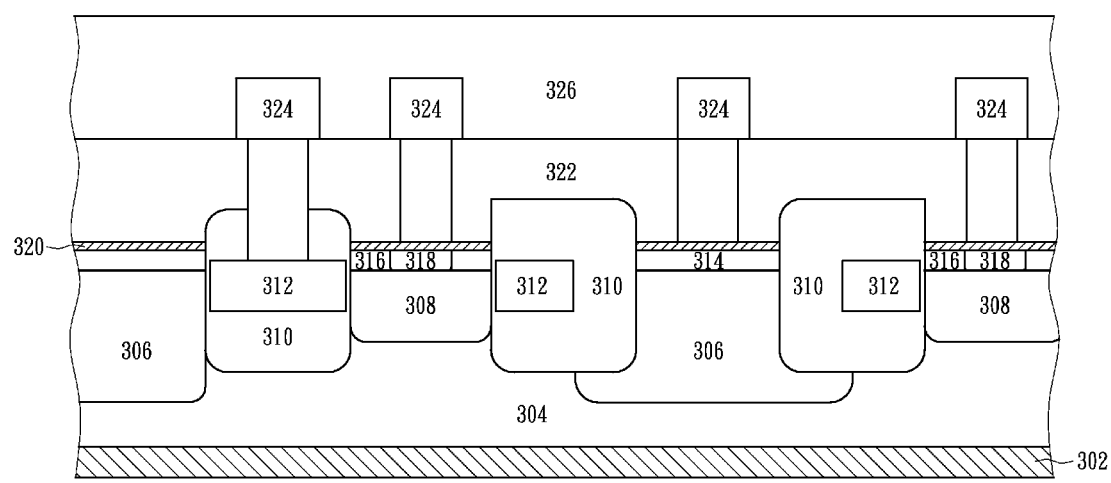
Figure 29:
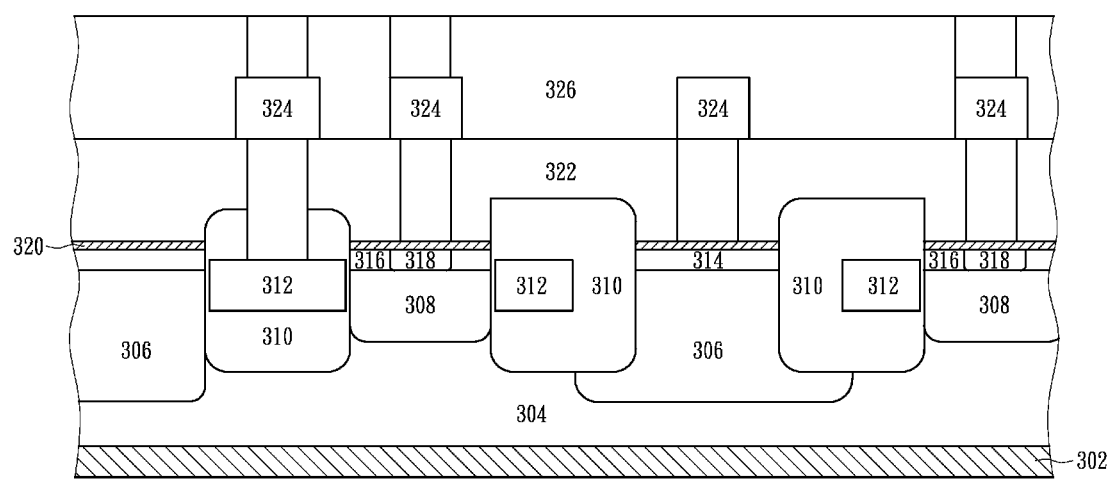
Figure 30:
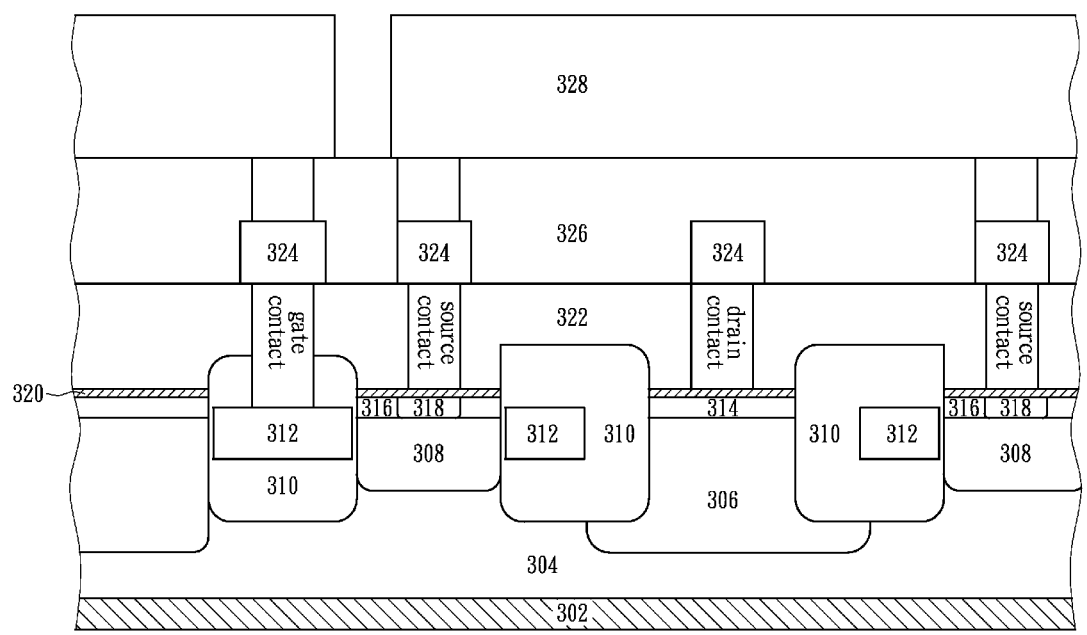

FIG. 24 shows the result of the contact etching process. FIG. 25 shows the removal of the contact photo masks 2300, the deposition of tungsten in the contact etching region to form the contacts of the source region, the drain region and the gate region, and the polishing of these contacts with CMP technique. FIG. 26 shows that the first metal layer 324 is disposed on the top of the inter layer dielectric layer 322, and first metal layer photo masks 2600 are formed at the contact area of the first metal layer 324. FIG. 27 shows the etching of the first metal layer 324 and the removal of the first metal layer photo masks 2600. FIG. 28 shows deposition of the inter metal dielectric layer 326 at the top of the inter layer dielectric layer 322 and the first metal layer 324, wherein the inter metal dielectric layer 326 is made of boron phosphate glass. FIG. 29 shows the result of forming via photo masks on the top of the inter metal dielectric layer 326, proceeding contact etching process, removal of the via photo masks, and deposition of tungsten in the contact regions to form vias. FIG. 30 shows the result of forming the top metal layer 328 on the top of the inter metal dielectric layer 326, forming photo masks on the top of the top metal layer 328, etching the top metal layer 328, and removing the photo masks.

In conclusion, the trench-typed power MOS transistor according to the present invention exhibit high breakdown voltage, high output current and high operation speed due to its unique structure. In addition, since the trench-typed power MOS transistor according to the present invention adopts a horizontal structure such that it can be integrated with other logic circuits on a CMOS-processed chip. As a result, the trench-typed power MOS transistor according to the present invention is more practical with lower manufacturing costs compared with the conventional trench-typed power MOS transistor.

The above-described embodiments of the present invention are intended to be illustrative only. Those skilled in the art may devise numerous alternative embodiments without departing from the scope of the following claims.

What is claimed is:

1. A trench-typed power MOS transistor, comprising:
a drain region having a first conductivity type property and connected to a drain electrode;
a double diffusion doping region having the first conductivity type property and disposed under the drain region;
a trench-typed gate region having a gate conductor and an insulating layer, wherein the insulating layer extends into the double diffusion doping region to insulate the gate conductor;
a source region having the first conductivity type property and connected to a source electrode;
a well region having a second conductivity type property and disposed under the source region;
a deep well region having the first conductivity type property and disposed under the double diffusion doping region and the well region; and
a substrate region disposed under the deep well region;
wherein the insulating layer forms a thin sidewall region between the gate conductor and the well region, a thick sidewall region between the gate conductor and the double diffusion doping region, and a thick bottom region between the gate conductor and the deep well region, and the drain electrode and the source electrode are disposed on the top surface of the trench-typed power MOS transistor.

2. The trench-typed power MOS transistor of claim 1, wherein the trench-typed gate region horizontally surrounds the well region.

3. The trench-typed power MOS transistor of claim 1, wherein the depth of the trench-typed gate region is less than 2 micrometers, the width of the trench-typed gate region is less than 2 micrometers, the depth of the gate conductor is ranging from 1 to 2 micrometers, the thickness of the thick bottom region is ranging from 0.02 to 1 micrometer, and the thickness of the thick sidewall region is ranging from 0.2 to 1 micrometer.

4. The trench-typed power MOS transistor of claim 1, wherein the depth of the trench-typed gate region is greater than 2 micrometers, the width of the trench-typed gate region is greater than 3 micrometers, the depth of the gate conductor is greater than 1.6 micrometer, the thickness of the thick bottom region is greater than 0.6 micrometer, and the thickness of the thick sidewall region is greater than 1 micrometer.

5. The trench-typed power MOS transistor of claim 1, wherein the doping concentration of the double diffusion doping region closer to the drain region is higher than the doping concentration of the double diffusion doping region farther from the drain region.

6. The trench-typed power MOS transistor of claim 1, wherein the top surfaces of the drain region and the source region are separated by the gate conductor.

7. The trench-typed power MOS transistor of claim 1, which further comprises a body region surrounded by the source region.

8. The trench-typed power MOS transistor of claim 1, which further comprises a metal silicide layer between the source region and the source electrode and between the drain region and the drain electrode.

9. The trench-typed power MOS transistor of claim 8, which further comprises an inter layer dielectric layer disposed above the metal silicide layer.

10. The trench-typed power MOS transistor of claim 9, which further comprises an inter metal dielectric layer disposed above the inter layer dielectric layer.

* * * * *